United States Patent
Chiang

(10) Patent No.: US 6,296,174 B1
(45) Date of Patent: *Oct. 2, 2001

(54) METHOD AND CIRCUIT BOARD FOR ASSEMBLING ELECTRONIC DEVICES

(75) Inventor: Chia-Tsuan Chiang, Pa-teh (TW)

(73) Assignee: Sony Video Taiwan Co. Ltd., (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/962,375

(22) Filed: Oct. 31, 1997

(30) Foreign Application Priority Data

Oct. 27, 1997 (TW) ................................................ 86115865

(51) Int. Cl.[7] ............................ B23K 31/02; B23K 33/00
(52) U.S. Cl. ......................... 228/214; 228/254; 228/258; 228/180.21
(58) Field of Search .................... 228/180.21, 248.1, 228/215, 216, 284.1, 180.22, 179.1, 254, 258

(56) References Cited

U.S. PATENT DOCUMENTS

| | | | |
|---|---|---|---|
| 4,396,140 | * | 8/1983 | Jaffe et al. .......................... 228/123 |
| 4,889,790 | * | 12/1989 | Roos et al. ........................... 439/258 |
| 5,172,852 | * | 12/1992 | Bernardoni et al. .............. 228/180.2 |
| 5,551,628 | * | 9/1996 | Van Geryen et al. . | |
| 5,660,321 | * | 8/1997 | Ishida et al. ......................... 228/254 |
| 5,675,889 | * | 10/1997 | Acocella et al. ................. 228/180.22 |
| 5,820,014 | * | 10/1998 | Dozier, II et al. ................... 228/56.3 |
| 5,842,275 | * | 12/1998 | McMillan, II et al. ................ 29/840 |
| 5,889,320 | * | 3/1999 | Phelps, Jr. et al. ................... 257/698 |
| 5,898,992 | * | 5/1999 | Annable ................................. 29/840 |
| 5,912,984 | * | 6/1999 | Michael et al. ....................... 382/149 |
| 5,972,734 | * | 10/1999 | Carichner et al. .................... 438/106 |

FOREIGN PATENT DOCUMENTS

| | | |
|---|---|---|
| 2058294 | 2/1990 | (JP) . |
| 4280655 | 10/1992 | (JP) . |
| 7336030 | 12/1995 | (JP) . |

* cited by examiner

Primary Examiner—Clifford C. Shaw
Assistant Examiner—Jonathan Johnson
(74) Attorney, Agent, or Firm—Frommer Lawrence & Haug, LLP.; William S. Frommer; Matthew K. Ryan

(57) ABSTRACT

A method for assembling electronic devices including a plurality of soldering pads for soldering contacts of electronic devices, and at least an insulated zone neighboring at least one of the soldering pads, from which soldering paste is extendible to at least a portion of the insulated zone while applying soldering paste. The method includes the steps of applying soldering paste onto at least a portion of the soldering pads allowing the soldering paste to extend outwardly from at least one soldering pad to locations not in contact with other soldering pads or traces, or to at least a portion of an insulated zone neighboring the soldering pad; and soldering contacts of electronic devices to the circuit board having the portion of soldering pads including the at least one soldering pad.

15 Claims, 3 Drawing Sheets

METHOD AND CIRCUIT BOARD FOR ASSEMBLING ELECTRONIC DEVICES

BACKGROUND OF THE INVENTION

According to the present invention, a circuit board and a method for assembling electronic devices, in particular an effective and simple solution for assembling electronic devices onto a circuit board having dense soldering pads and/or dense traces is disclosed.

Due to the facts that surface-mounting electronic devices onto the surface of a circuit board eliminates drilling of the circuit board as well as considerably increases the circuit density, and that soldering paste can be precisely applied over soldering pads by screen printing, Surface Mounting Technology (SMT) has become the primary method for assembling electronic devices onto circuit boards.

However, the trend of electronic industry is to produce electronic devices, such as integrated circuits ("IC's"), having considerably more and denser contacts, which require more, smaller, and denser soldering pads on the circuit board. The gaps between neighboring soldering pads and/or distance between soldering pads and neighboring traces must be reduced as a result of such smaller soldering pads, on which only tiny amount of soldering paste is applicable so as to eliminate the possibility of joining neighboring soldering pads or neighboring traces that ultimately result in short-circuits. Nevertheless, the tiny amount of soldering paste being applied onto the smaller soldering pads is insufficient to facilitate ideal soldering joints and thus reduces the reliability of soldering, and further deteriorates the quality of the entire circuits after completion.

To ensure the reliability of soldering, the measure generally adopted by the industry relates to limiting soldering pads to a predetermined dimension. However, such a limitation prevents further development of denser soldering pads and/or traces printed on the circuit board, and thus indirectly impedes development of electronic industry. An alternative measure adopted by the industry includes applying solder directly over the soldering pads, placing contacts of devices on the soldering pads plated with solidified solder, and melting the solder to connect the contacts and soldering pads. However, such a measure frequently causes bending of the contacts due to inconsistent thickness in solder plating, while controlling thickness of solder plating involves great difficulty.

An effective soldering solution for high-density soldering pads and/or closely neighboring soldering pads and traces is thus immediately required.

SUMMARY OF INVENTION

It is an objective of this invention to provide an effective and simple solution for assembling electronic devices onto a circuit board having dense soldering pads and/or dense traces It is another objective of this invention to provide a novel circuit board having dense soldering pads and/or dense traces, which circuit board facilitates reliable soldering process for assembling electronic devices thereon.

Based on research conducted by the Applicant, it is known that because the soldering pads are either located at terminated ends of or a part of the conductive zone (such as copper foils), a stronger bond is formed between its conductive substance and the soldering paste. Therefore, when contacts of electronic devices are soldered to the soldering pads, the molten soldering paste eventually agglomerates the soldering paste extending to periphery insulated zones or applied insulated zones approaching the soldering pads and the contacts of electronic devices due to its surface tension whereby sufficient amount of soldering paste is provided between the soldering pads and the contacts to form ideal soldering joints.

Accordingly, the method disclosed in this invention primarily relates to applying soldering paste to soldering pads allowing the soldering paste to extend outwardly from at least one soldering pad to locations not in contact with other soldering pads or traces; and soldering contacts of electronic devices to the circuit board having the portion of soldering pads including said one soldering pad. Furthermore, the method and circuit board disclosed in this invention relate to applying at least an insulated zone onto a circuit board at locations having high-density soldering pads or locations having closely neighboring soldering pads and traces, wherein the insulated zone is in various configurations so as to abut on one or more than one soldering pads. The insulated zone primarily provides a region to which soldering paste extends. As for densely aligned soldering pads, soldering paste being applied to the soldering pads is extendible to the neighboring insulated zone, whereby the soldering paste being additionally applied to the soldering pads facilitates an effective soldering process. As for closely neighboring soldering pads and traces, the insulated zone provides a region to which soldering paste extends, wherein the insulated zone covers traces that closely abut on the soldering pads to facilitate application of soldering paste and to provide effective shielding whereby any possibility of short-circuits is eliminated.

The electronic devices referred in this invention include various semiconductor devices, resistors, capacitors, inductors, connectors, sockets for device contacts, signal routes, leads, or other circuit components or devices that is solderable to circuit boards.

In summary, the problems encountered in the process of soldering electronic devices as a result of high-density soldering pads and/or closely neighboring soldering pads and traces are solved by the technical measures disclosed in this invention.

BRIEF DESCRIPTIONS OF DRAWINGS

EXPLANATIONS OF PREFERRED EMBODIMENTS

The concept of this invention is explained by the following preferred embodiments in conjunction with the drawings.

Figure 1A:
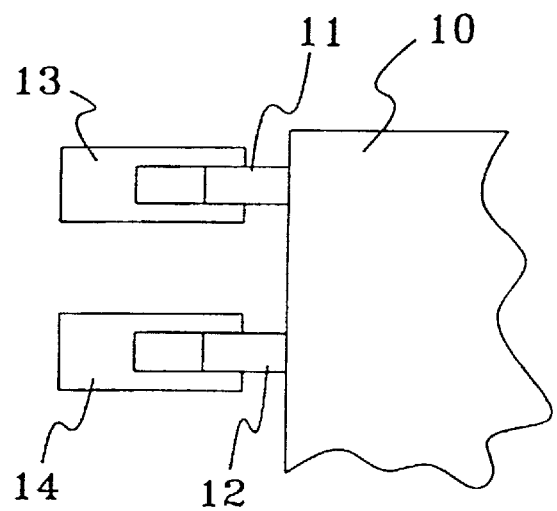
FIG. 1A is a top plan view illustrating an electronic device being assembled to a circuit board by conventional SMT method.
Figure 1B:
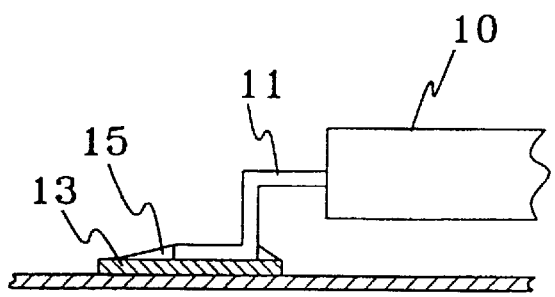
FIG. 1B is a side elevational view of FIG. 1A.

FIG. 1A is a top plan view illustrating an electronic device 10 (such as an IC) being assembled to a circuit board (such as a Printed Circuit Board) by conventional SMT method, wherein contacts 11 and 12 of the electronic device 10 are respectively soldered to soldering pads 13 and 14. FIG. 1B is a side elevational view of FIG. 1A, wherein soldering paste 15 is applied to solder the contact 11 and the soldering pad 13. The soldering paste 15 being applied to the soldering pad 13 must be sufficient to form an ideal soldering joint between the soldering pad 13 and the contact 11.

Figure 2:
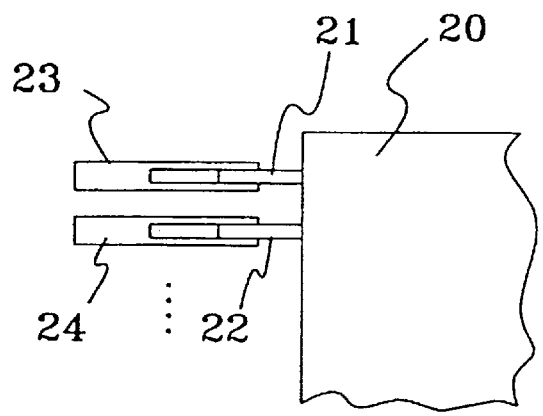
FIG. 2 is a top plan view illustrating an electronic devices having high-density contacts being assembled to a circuit board.

As for an electronic device 20 having more and denser contacts, the size of and the gaps formed between soldering pads provided on the circuit board are smaller as shown in FIG. 2. In FIG. 2, the size of and the gap formed between soldering pads 23 and 24 is considerably smaller than that of and formed between the soldering pads 13 and 14. As a result, the amount of soldering paste that is applicable to the soldering pads 23 and 24, is considerably less than that to the soldering pads 13 and 14, whereby an ideal soldering joint can hardly be formed between the contact 21 (or 22) and the soldering pad 23 (or 24) and the quality of the entire circuits is further deteriorated.

Figure 3A:
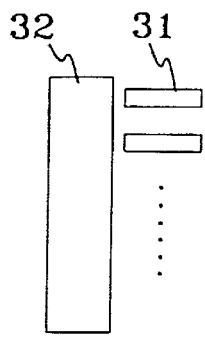
FIGS. 3A–3D are top plan views illustrating an embodiment of this invention.
Figure 3E:
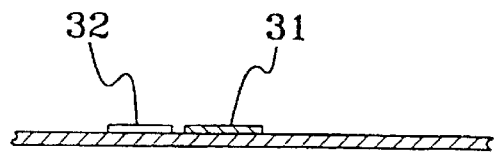
FIGS. 3E–3H are side elevational views of FIGS. 3A–3D respectively.
Figure 3B:
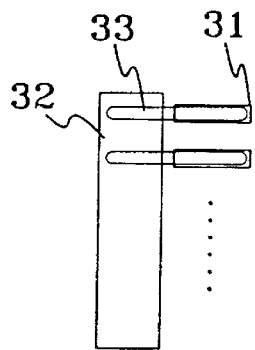
Figure 3F:
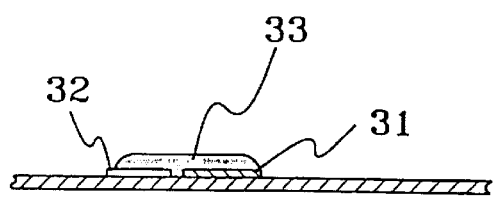
Figure 3C:
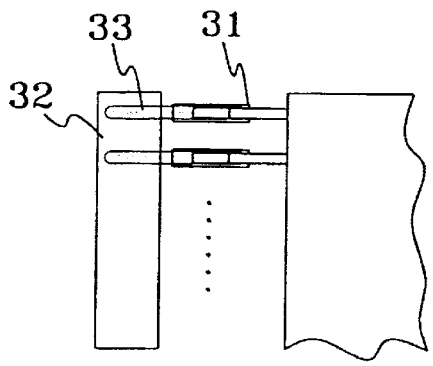

FIGS. 3A–3C illustrate an embodiment of this invention, where FIG. 3A illustrates a circuit board according to this invention. The circuit board comprises a plurality of densely aligned soldering pads 31 and at least an insulated zone 32 neighboring the soldering pads 31. The soldering pads 31 are either located at terminated ends of conductive zone (such as copper foils) of the circuit board or a part of the conductive zone. The insulated zone 32 may be printed onto the circuit board by conventional screen printing, adhered onto the circuit board by tapes, or a part of insulated zone originally provided on the circuit board. In case the soldering pads 31 closely abut on other traces, the insulated zone 32 may cover the neighboring traces. Besides, the insulated zone 32 may border the soldering pads, closely abut on or overlay a portion of the soldering pads. While applying soldering paste 33, the soldering paste 33 is extendible from the soldering pads 31 to a portion of the soldering zone 32 whereby sufficient solder paste is provided to form ideal soldering joints. The conventional steel screen printing or any other known methods may be adopted for application of soldering paste 33. Soldering paste may be conventionally known eutectic composition soldering paste (e.g. Type No. TCS-44-63 manufactured by Tarutin Co., Ltd.), low melting point type soldering paste (e.g. Type No. TCS-43-B8 manufactured by Tarutin Co., Ltd.), or precursors of solder substance used in various soldering processes.

Figure 3G:
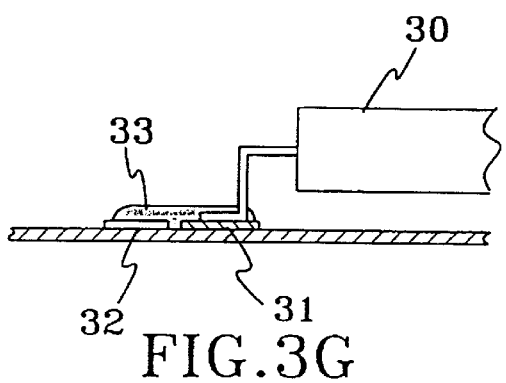

As shown in FIGS. 3C and 3G, after the application of soldering paste, contacts of an electronic device 30 are then placed over the soldering pads for subsequent reflow process.

Figure 3D:
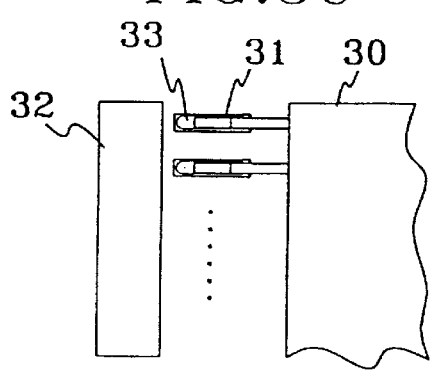
Figure 3H:
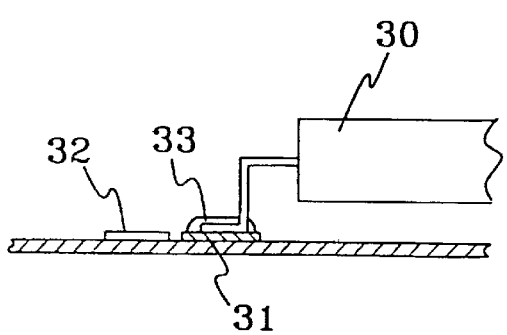

In the reflow process, the soldering paste 33 is first melted by heat or by exposing to strong light. The molten soldering paste 33 then agglomerates the soldering paste extending to the insulated zone 32 approaching soldering pads 31 and contacts of the electronic device 30 due to its surface tension and stronger bond between the soldering pads and soldering paste, as that shown in FIGS. 3D and 3H. The assembly of the electronic device is then completed by cooling the molten soldering paste 33 for solidification. In an alternative embodiment that the insulated zone 32 is in the form of tapes adhered to the circuit board, the insulated zone 32 may be removed from the circuit board after soldering is completed. Therefore, it is not essential whether the insulated zone is insulative because the insulated zone 32 adhered to the circuit board is ultimately removed from the circuit board. In another embodiment of printing the insulated zone 32 onto the circuit board by screen printing, the insulated zone 32 includes any appropriate insulative substance, such as the substance, for example, Type No. USI-210 or Type No. 210W-28 manufactured by Tamura, used to print indicative illustrations or numerals onto the circuit board so as to be simultaneously printed onto the circuit board in the process of printing the indicative illustrations or numerals.

Figure 4A:
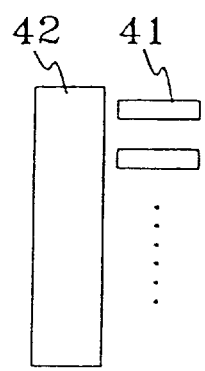
FIGS. 4A–4E illustrate alternative embodiments of insulated zones according to this invention.
Figure 4C:
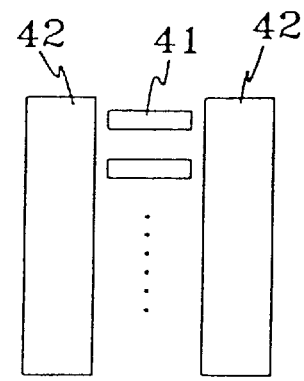
Figure 4B:
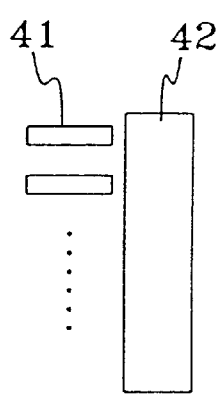
Figure 4D:
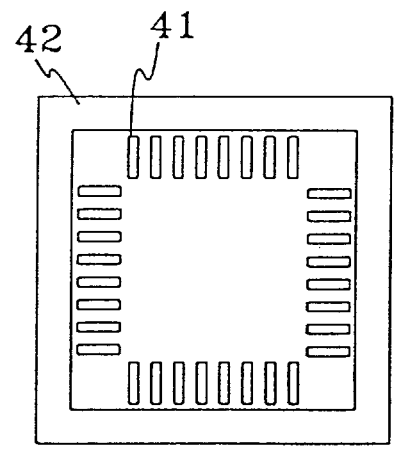
Figure 4E:
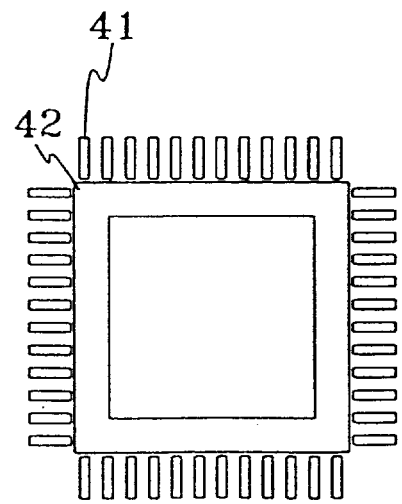

FIGS. 4A–4E illustrate alternative embodiments of insulated zones according to this invention, where FIG. 4A illustrates an insulated zone 42 being located outside of soldering pads 41 (the electronic device being located inside of the soldering pads), FIG. 4B illustrates an insulated zone 42 being located inside of the soldering pads 42, FIG. 4C illustrates insulated zones 42 being located at opposing sides of soldering pads 41, FIG. 4D illustrates an insulated zone surrounding the periphery of soldering pads 41, and FIG. 4E illustrates an insulated zone 42 being surrounded by the soldering pads.

Various changes and implementations with respect to the aforementioned circuit board or method for assembling electronic devices, made by those skilled in the art without departing from the technical concept of the present invention are within the scope of the appended claims.

What is claimed is:

1. A method for assembling electronic devices onto a circuit board, said method comprising the following steps:

applying a plurality of densely aligned soldering pads onto the circuit board;

applying soldering paste directly onto the circuit board and onto at least a portion of soldering pads positioned on said circuit board allowing said soldering paste to extend outwardly from at least one soldering pad to locations on the circuit board which are not in contact with other soldering pads or traces; and soldering contacts of electronic devices to said circuit board wherein said contacts are placed over said soldering pads and the soldering paste is agglomerated by a reflow process from said non-contact locations directly to said contacts without the necessity of flux.

2. The method set forth in claim 1, wherein said electronic devices include semiconductor devices, resistors, capacitors, inductors, connectors, sockets for device contacts, signal routes, or leads.

3. The method set forth in claim 1, wherein said soldering paste is applied onto said circuit board by steel screen printing.

4. The method set forth in claim 1, wherein said soldering step further comprising the steps of:

melting said soldering paste; and cooling said molten soldering paste for solidification.

5. A method for assembling electronic devices onto a circuit board, said method comprising the following steps:

applying a plurality of densely aligned soldering pads onto the circuit board;

applying at least one insulated zone onto said circuit board neighboring the soldering pads;

applying soldering paste directly onto the circuit board and onto at least a portion of said soldering pads of said circuit board allowing said soldering paste to extend from said at least one soldering pad to at least a portion of said insulated zone; and soldering contacts of electronic devices to said circuit board wherein said contacts are placed over said soldering pads and the soldering paste is agglomerated by a reflow process from said portion of said insulated zone directly to said contacts without the necessity of flux.

6. The method set forth in claim 5, wherein said insulated zone covers traces neighboring said at least one soldering pad of said circuit board.

7. The method set forth in claim 5, wherein said electronic devices include semiconductor devices, resistors, capacitors, inductors, connectors, sockets for device contacts, signal routes, or leads.

8. The method set forth in claim 5, wherein said insulated zone is applied onto said circuit board by screen printing.

9. The method set forth in claim 5, wherein said insulated zone is in the form of tapes adhered to said circuit board.

10. The method set forth in claim 9 further comprising the step of removing said tapes after soldering is completed.

11. The method set forth in claim 5, wherein said insulated zone closely abuts on said at least one soldering pad.

12. The method set forth in claim 5, wherein said insulated zone partly overlays said at least one soldering pad.

13. The method set forth in claim 5, wherein said soldering paste is applied onto said circuit board by steel screen printing.

14. The method set forth in claim 5, wherein said soldering step further comprising the steps of:
    melting said soldering paste; and
    cooling said molten soldering paste for solidification.

15. A method for assembling electronic devices onto a circuit board having a plurality of soldering pads, said method comprising the following steps:
    applying at least an insulated zone onto said circuit board closely neighboring at least one soldering pad wherein said insulated zone partly overlays said at least one soldering pad;
    applying soldering paste onto at least a portion of soldering pads of said circuit board allowing said soldering paste to extend from said at least one soldering pad to at least a portion of said insulated zone; and
    soldering contacts of electronic devices to said circuit board having said portion of soldering pads including said at least one soldering pad.

* * * * *